US012328964B2

(12) United States Patent
Lu et al.

(10) Patent No.: US 12,328,964 B2
(45) Date of Patent: Jun. 10, 2025

(54) SECONDARY TRIMMING DEVICE FOR PHOTOVOLTAIC ASSEMBLY

(71) Applicant: SUZHOU SC-SOLAR EQUIPMENT CO., LTD, Suzhou (CN)

(72) Inventors: Zhiqiang Lu, Suzhou (CN); Zhongzhou Jiang, Suzhou (CN); Chunfeng Zhang, Suzhou (CN)

(73) Assignee: SUZHOU SC-SOLAR EQUIPMENT CO., LTD, Suzhou (CN)

( * ) Notice: Subject to any disclaimer, the term of this patent is extended or adjusted under 35 U.S.C. 154(b) by 0 days.

(21) Appl. No.: 18/777,107

(22) Filed: Jul. 18, 2024

(65) Prior Publication Data

US 2024/0372030 A1     Nov. 7, 2024

Related U.S. Application Data

(63) Continuation of application No. PCT/CN2022/136903, filed on Dec. 6, 2022.

(30) Foreign Application Priority Data

Jan. 29, 2022   (CN) .......................... 202210110591.2

(51) Int. Cl.
  *B23P 19/00*   (2006.01)
  *B26D 1/28*   (2006.01)
  (Continued)

(52) U.S. Cl.
  CPC .............. *H10F 71/00* (2025.01); *B26D 1/28* (2013.01); *B26D 5/06* (2013.01); *B26D 7/18* (2013.01); *B26D 7/2628* (2013.01)

(58) Field of Classification Search
  CPC .......... B26D 7/18; B26D 7/2628; B26D 1/28; B26D 5/06; H01L 31/186
  See application file for complete search history.

(56) References Cited

U.S. PATENT DOCUMENTS

| 9,555,996 | B2 * | 1/2017 | Stauber | ................ B26D 7/0675 |
| 2006/0012300 | A1 | 1/2006 | Lan et al. | |
| 2011/0107887 | A1 * | 5/2011 | Strass | ....................... B24B 9/20 83/13 |

FOREIGN PATENT DOCUMENTS

| CN | 201936907 U | 8/2011 |
| CN | 102947063 A | 2/2013 |

(Continued)

OTHER PUBLICATIONS

First Office Action; The State Intellectual Property Office of People's Republic of China; Chinese Patent Application No. CN206271737U; Nov. 24, 2023; 13 pages.

(Continued)

*Primary Examiner* — Paul D Kim
(74) *Attorney, Agent, or Firm* — Taft Stettinius & Hollister LLP (57) ABSTRACT

Provided is a secondary trimming device for a photovoltaic assembly. The secondary trimming device mainly includes first clamping drive apparatuses, second clamping drive apparatuses, and a fixing base. A blade is disposed on one side of one first clamping drive apparatus facing a photovoltaic assembly. The first clamping drive apparatus can drive the blade to get close to the photovoltaic assembly. One second clamping drive apparatus is connected to one end of the first clamping drive apparatus facing away from the photovoltaic assembly and can drive the first clamping drive apparatus to rotate. The first clamping drive apparatuses and the second clamping drive apparatuses are each disposed on the fixing base.

16 Claims, 5 Drawing Sheets

(51) Int. Cl.
*B26D 5/06* (2006.01)
*B26D 7/18* (2006.01)
*B26D 7/26* (2006.01)
*H05K 13/04* (2006.01)
*H10F 71/00* (2025.01)

(56) References Cited

FOREIGN PATENT DOCUMENTS

| | | |
|---|---|---|
| CN | 104608164 A | 5/2015 |
| CN | 204777642 U | 11/2015 |
| CN | 105983731 A1 | 10/2016 |
| CN | 206271737 U | 6/2017 |
| CN | 206393681 U | 8/2017 |
| CN | 207669399 U | 7/2018 |
| CN | 108656168 A | 10/2018 |
| CN | 212352212 U | 1/2021 |
| CN | 112563375 A | 3/2021 |
| CN | 212684046 U | 3/2021 |
| CN | 213468731 U | 6/2021 |
| CN | 114474193 A | 5/2022 |
| DE | 202008008794 U1 | 12/2008 |
| EP | 2409818 A1 | 1/2012 |
| JP | 2017092413 A | 5/2017 |
| KR | 101075953 B1 | 10/2011 |

OTHER PUBLICATIONS

International Search Report; China National Intellectual Property Administration; International Application No. PCT/CN2022/136903; Mar. 1, 2023; 5 pages.

\* cited by examiner

SECONDARY TRIMMING DEVICE FOR PHOTOVOLTAIC ASSEMBLY

CROSS-REFERENCE TO RELATED APPLICATIONS

This application is a continuation of International Patent Application No. PCT/CN2022/136903 filed Dec. 6, 2022, which claims priority to Chinese Patent Application No. 202210110591.2 filed Jan. 29, 2022, disclosures of both of which are incorporated herein by reference in their entireties.

TECHNICAL FIELD

The present application relates to the technical field of photovoltaic assembly production devices, for example, a secondary trimming device for a photovoltaic assembly.

BACKGROUND

In the production process of a photovoltaic assembly, the photovoltaic assembly needs to go through a lamination procedure. After the lamination procedure, the curing adhesive in the photovoltaic assembly may overflow from four sides of the photovoltaic assembly. Therefore, an operator needs to remove the overflowing curing adhesive to meet the production requirements of the photovoltaic assembly.

In the related art, an operator usually uses a trimmer to remove the overflowing curing adhesive. However, the trimmer cannot remove the residual curing adhesive at four corners of the photovoltaic assembly, making it more difficult in the subsequent framing process and resulting in improper assembly of the frame of the photovoltaic assembly, which will reduce the stability and reliability of the photovoltaic assembly, and affect its service life.

SUMMARY

The present application provides a secondary trimming device for a photovoltaic assembly. The device includes first clamping drive apparatuses, second clamping drive apparatuses, and a fixing base.

A blade is disposed on one side of one first clamping drive apparatus facing a photovoltaic assembly. The first clamping drive apparatus can drive the blade to get close to the photovoltaic assembly.

One second clamping drive apparatus is connected to one end of the first clamping drive apparatus away from the photovoltaic assembly and can drive the first clamping drive apparatus.

The first clamping drive apparatuses and the second clamping drive apparatuses are each disposed on the fixing base.

BRIEF DESCRIPTION OF DRAWINGS

The drawings used in description of embodiments of the present application will be described below. The drawings described below merely illustrate some embodiments of the present application, and those of ordinary skill in the art may obtain other drawings based on the contents of the embodiments of the present application and these drawings without any creative work.

REFERENCE LIST 100 first clamping drive apparatus
110 blade
120 connection plate
200 second clamping drive apparatus
300 push-out drive apparatus
310 first support plate
311 receiver channel
400 lifting drive apparatus
410 second support plate
500 fixing base
510 slide rail
520 third support plate
521 sliding chute
530 fixing member
600 material receiving box
700 structure frame
710 long-edge correction assembly
711 long-edge drive apparatus
712 correction rod
713 roller
720 short-edge correction assembly
721 short-edge drive apparatus

DETAILED DESCRIPTION

In the description of the present application, terms "joined", "connected" and "fixed" are to be understood in a broad sense unless otherwise expressly specified. For example, the term "connected" may refer to "fixedly connected", "detachably connected", or "integrated", may refer to "mechanically connected" or "electrically connected", or may refer to "connected directly", "connected indirectly through an intermediary", or "connected inside two elements" or "an interaction relation between two elements". For those of ordinary skill in the art, meanings of the preceding terms in the present application may be understood as the case.

In the present application, unless otherwise expressly specified, when a first feature is described as "on" or "below" a second feature, the first feature and the second feature may be in direct contact or be in contact via another feature between the two features instead of being in direct contact. Moreover, when the first feature is described as "on", "above", or "over" the second feature, the first feature is right on, above, or over the second feature, the first feature is obliquely on, above, or over the second feature, or the first feature is simply at a higher level than the second feature. When the first feature is described as "under", "below", or "underneath" the second feature, the first feature is right under, below, or underneath the second feature, the first feature is obliquely under, below, or underneath the second feature, or the first feature is simply at a lower level than the second feature.

In the description of one or more embodiments, the orientation or position relationships indicated by terms "above", "below", "left", "right" and the like are based on the orientation or position relationships shown in the drawings. These orientations or position relationships are merely for ease of description and simplifying an operation and do not indicate or imply that the referred device or element must have a specific orientation and must be constructed and operated in a specific orientation. Moreover, the terms "first" and "second" are only used for distinguishing between descriptions and have no special meanings.

As shown in FIGS. 1 to 4, one or more embodiments provide a secondary trimming device for a photovoltaic assembly, which is used for the secondary trimming for a photovoltaic assembly after being trimmed by a trimmer, for example, for the secondary cleaning of the curing adhesive at four corners of the photovoltaic assembly. The secondary trimming device for a photovoltaic assembly mainly includes first clamping drive apparatuses 100, second clamping drive apparatuses 200, and a fixing base 500. A blade 110 is disposed on one side of a first clamping drive apparatus 100 facing the photovoltaic assembly. The first clamping drive apparatus 100 can drive the blade 110 to get close to the photovoltaic assembly. A second clamping drive apparatus 200 is connected to one end of the first clamping drive apparatus 100 facing away from the photovoltaic assembly and can drive the first clamping drive apparatus 100 to rotate. The first clamping drive apparatuses 100 and the second clamping drive apparatuses 200 are each disposed on the fixing base 500.

The secondary trimming device for a photovoltaic assembly can remove the residual curing adhesive at four corners of a photovoltaic assembly, thereby facilitating the subsequent framing process, improving the stability and reliability, and extending the service life of the photovoltaic assembly.

Optionally, in one or more embodiments, the first clamping drive apparatuses 100 and the second clamping drive apparatuses 200 each use a cylinder for driving. Of course, an operator may also select, in light of situation on the ground, other drive components for driving. Moreover, in one or more embodiments, two first clamping drive apparatuses 100 and two second clamping drive apparatuses 200 are provided. Each second clamping drive apparatus 200 is connected to a first clamping drive apparatus 100 through a connection plate 120. The second clamping drive apparatuses 200 can drive connection plates 120 to rotate respectively, thereby enabling the connection plates 120 to drive the first clamping drive apparatuses 100 to rotate respectively. Accordingly, two blades 110 on the two first clamping drive apparatuses 100 can cut and remove the curing adhesive at the corners of the photovoltaic assembly.

Exemplarily, the second clamping drive apparatuses 200 drive the connection plates 120 to rotate in the horizontal direction. In this case, the two first clamping drive apparatuses 100 can get close to each other so that the two blades 110 get close to each other. Finally, end portions of the two blades 110 abut against each other. In this case, the curing adhesive at the corners of the photovoltaic assembly is cut and removed by the two blades 110. It is to be noted that the operator can adjust angles of the blades 110 in advance so that the blades 110, when not cutting the curing adhesive at the corners of the photovoltaic assembly, can abut against side edges of the photovoltaic assembly. With this arrangement, the two blades 110 can remove the curing adhesive at the corners of the photovoltaic assembly by performing one round of cutting, thereby improving the working efficiency of the secondary trimming device for a photovoltaic assembly.

Compared with the related art, the secondary trimming device for a photovoltaic assembly drives, through the second clamping drive apparatuses 200, the first clamping drive apparatuses 100 to rotate so as to enable the blades 110 on the first clamping drive apparatuses 100 to cut and remove the curing adhesive at the four corners of the photovoltaic assembly, thereby avoiding the residual curing adhesive at the four corners of the photovoltaic assembly, facilitating the subsequent framing process, thus improving the stability and reliability, and extending the service life of the photovoltaic assembly.

Figure 4:
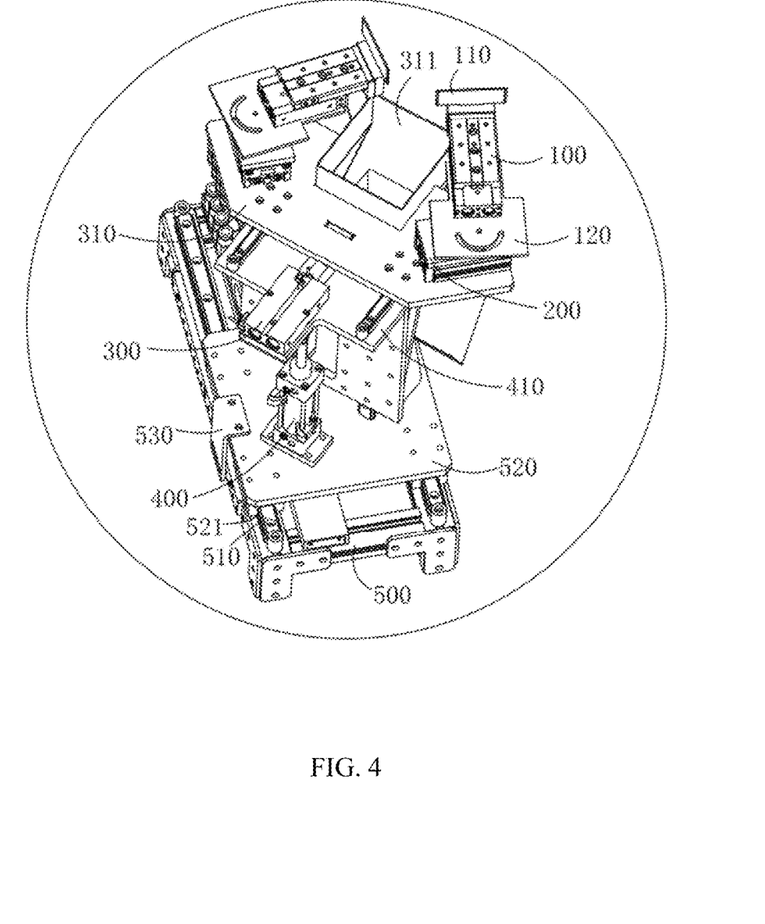
FIG. 4 is a partial enlarged view of part A of FIG. 3.

As shown in FIG. 4, in one or more embodiments, the secondary trimming device for a photovoltaic assembly further includes a push-out drive apparatus 300, a first support plate 310, a lifting drive apparatus 400, and a second support plate 410. The second clamping drive apparatuses 200 are disposed on the first support plate 310. The push-out drive apparatus 300 is connected to the first support plate 310 and can drive the first support plate 310 to move in a direction facing the photovoltaic assembly. The push-out drive apparatus 300 is disposed on the second support plate 410. The lifting drive apparatus 400 is connected to the second support plate 410 and can drive the second support plate 410 to go up and down.

In one or more embodiments, when the operator needs to perform secondary trimming at the corners of the photovoltaic assembly, the lifting drive apparatus 400 drives the second support plate 410 to go up and down in the vertical direction first so that the push-out drive apparatus 300 on the second support plate 410 can get close to the photovoltaic assembly. The push-out drive apparatus 300 pushes out the first support plate 310, thereby enabling the first support plate 310 to get close to the photovoltaic assembly in the horizontal direction. Moreover, the blades 110 on the first clamping drive apparatuses 100 abut adjust the side edges of the photovoltaic assembly. It is to be noted that the two blades 110 abut against the two side edges of the photovoltaic assembly respectively in this case. Then the two second clamping drive apparatuses 200 simultaneously drive the two first clamping drive apparatuses 100 to get close to each other. That is, the two blades 110 cut the curing adhesive at the corners of the photovoltaic assembly. When the end portions of the two blades abut against each other, the curing adhesive at the corners of the photovoltaic assembly can be cut.

In one or more embodiments, after the end portions of the two blades 110 abut against each other, the push-out drive apparatus 300 may further drive the first support plate 310 to retract so that the first clamping drive apparatuses 100 on the first support plate 310 and the second clamping drive apparatuses 200 on the first support plate 310 can get away from the photovoltaic assembly in the horizontal direction, thereby enabling the blades 110 on the first clamping drive apparatuses 100 to get away from the photovoltaic assembly in the horizontal direction and separating the curing adhesive from the photovoltaic assembly. It is to be noted that when the curing adhesive is not fully cured and becomes adherent, the curing adhesive can still be separated from the photovoltaic assembly through the retraction of the push-out drive device 300.

Optionally, in the actual production process, the operator may set one secondary trimming device for a photovoltaic assembly at each of the four corners of the photovoltaic assembly so that four secondary trimming devices for a photovoltaic assembly can cut the curing adhesive at the four corners of the photovoltaic assembly simultaneously, thereby improving the working efficiency of each secondary trimming device for a photovoltaic assembly, improving the uniformity of the force on the photovoltaic assembly, and avoiding the risk of stress concentration in the photovoltaic assembly.

Optionally, in some embodiments of the present application, the operator may select a cylinder, a motor, or another drive component to serve as the push-out drive apparatus 300 or the lifting drive apparatus 400.

As shown in FIG. 4, in one or more embodiments, the secondary trimming device for a photovoltaic assembly further includes a third support plate 520 disposed on the fixing base 500. The lifting drive apparatus 400 is disposed on the third support plate 520. The third support plate 520 can support the lifting drive apparatus 400, the second support plate 410, the push-out drive apparatus 300 on the second support plate 410, the first support plate 310, the first clamping drive apparatuses 100 on the first support plate 310, and the second clamping drive apparatuses 200 on the first support plate 310, avoiding the shaking and instability the preceding components when the secondary trimming device for a photovoltaic assembly works normally.

Optionally, with continued reference to FIG. 4, in one or more embodiments, a slide rail 510 is disposed on the fixing base 500. A sliding chute 521 is disposed on the third support plate 520. The sliding chute 521 is slidably connected to the slide rail 510. In this manner, the third support plate 520 can slide along the slide rail 510, thereby enabling the third support plate 520 to drive the lifting drive apparatus 400, the push-out drive apparatus 300, the first clamping drive apparatuses 100, and the second clamping drive apparatuses 200 to move relative to the fixing base 500. Therefore, the blades 110 on the first clamping drive apparatuses 100 can abut against the side edges of the photovoltaic assembly flexibly and conveniently, enabling the secondary trimming device for a photovoltaic assembly to be applicable to perform secondary trimming for photovoltaic assemblies of different models and sizes, improving the applicability of the secondary trimming device for a photovoltaic assembly.

In one or more embodiments, the secondary trimming device for a photovoltaic assembly further includes a fixing member 530 configured to connect the third support plate 520 and the fixing base 500. When the third support plate 520 moves to an appropriate position, the operator can fix the third support plate 520 at the appropriate position through the fixing member 530 so that the third support plate 520 can remain stable relative to the fixing base 500, thereby improving the stability and reliability of the secondary trimming device for a photovoltaic assembly in use.

Figure 2:
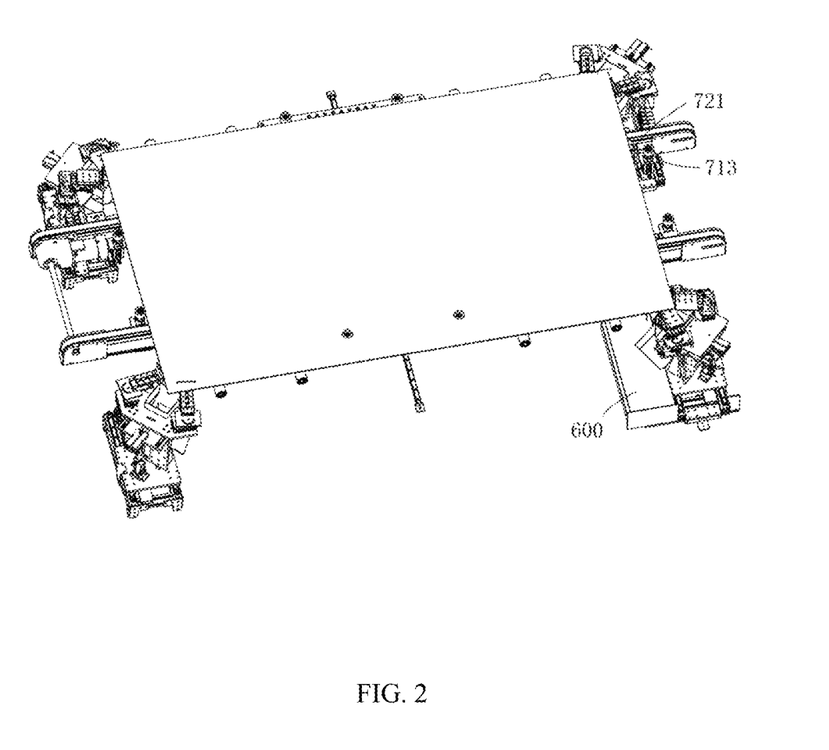
FIG. 2 is a structural view of a secondary trimming device for a photovoltaic assembly with a photovoltaic assembly placed therein according to the present application.
Figure 3:
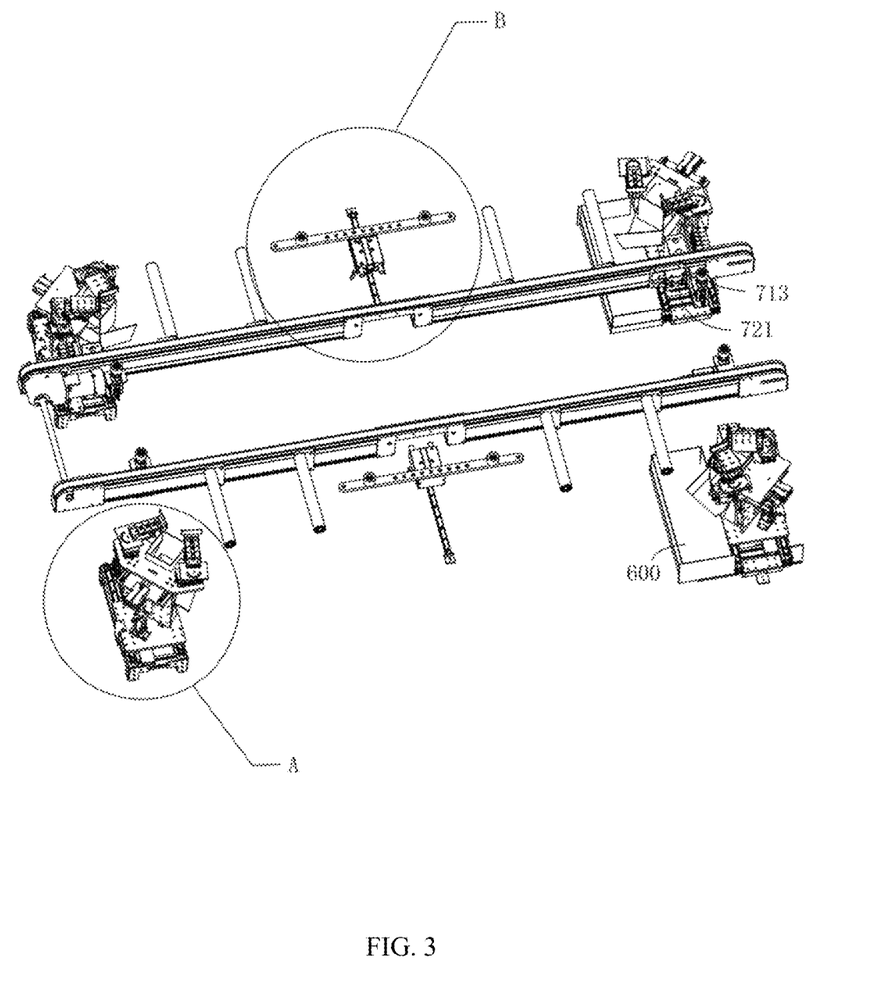
FIG. 3 is a structural view of a secondary trimming device for a photovoltaic assembly with no photovoltaic assembly placed therein according to the present application.

Optionally, referring to FIGS. 2 and 3, in one or more embodiments, the secondary trimming device for a photovoltaic assembly further includes a material receiving box 600. A receiver channel 311 is disposed on the first support plate 310. The receiver channel 311 communicates with the material receiving box 600. In this case, the curing adhesive cut by the blades 110 can drop into the receiver channel 311 directly and slide into the material receiving box 600 from the receiver channel 311, preventing the cut curing adhesive from getting deposited on the ground or inside the secondary trimming device for a photovoltaic assembly, thereby improving the cleanliness of the working site, and improving the working efficiency of the operator.

Figure 1:
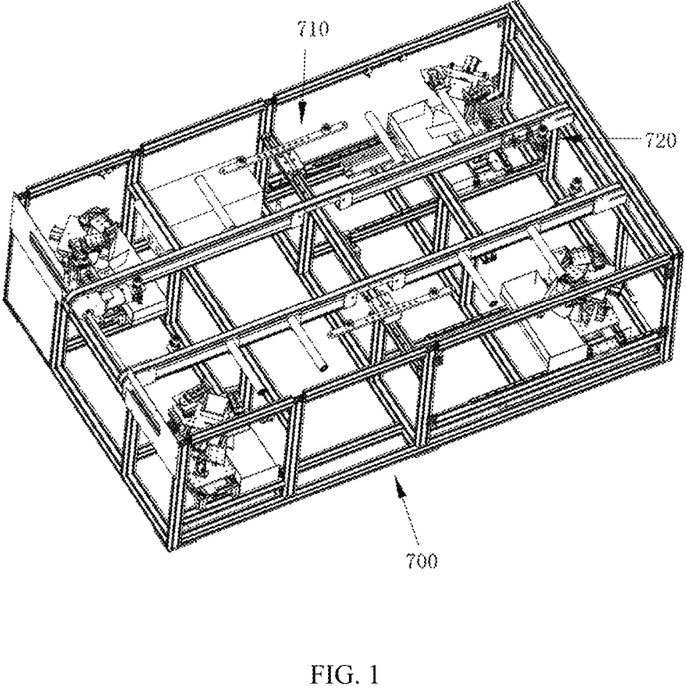
FIG. 1 is a structural view of a secondary trimming device for a photovoltaic assembly with a structure frame according to the present application.
Figure 5:
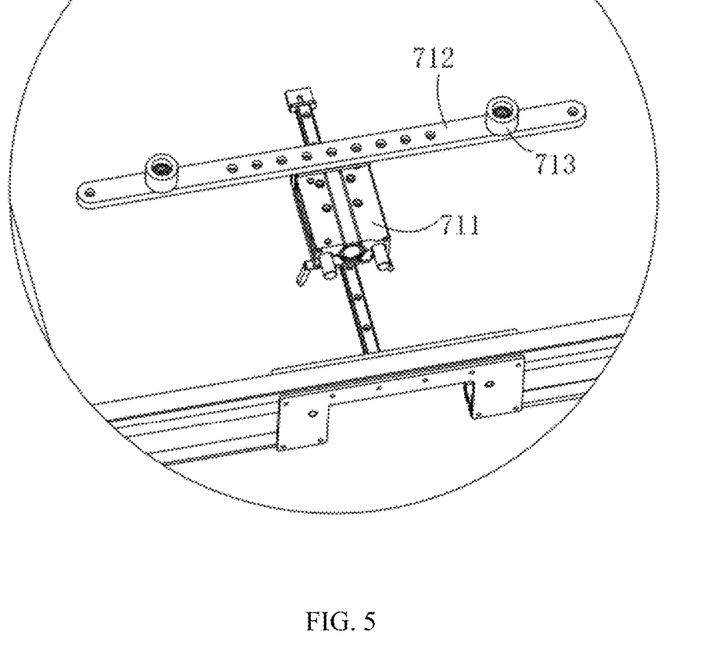
FIG. 5 is a partial enlarged view of part B of FIG. 3.

As shown in FIGS. 1 and 5, in one or more embodiments, the secondary trimming device for a photovoltaic assembly further includes a structure frame 700, a long-edge correction assembly 710, and a short-edge correction assembly 720. The structure frame 700 is configured to connect and fix the at least one secondary trimming assembly 10. The long-edge correction assembly 710 and the short-edge correction assembly 720 are each disposed on the structure frame 700. The photovoltaic assembly is generally rectangular. That is, the photovoltaic assembly has two long edges and two short edges. The long-edge correction assembly 710 can correct positions of the long edges of the photovoltaic assembly placing at the secondary trimming device. The short-edge correction assembly 720 can correct positions of the short edges of the photovoltaic assembly placing at the secondary trimming device. In this case, when the photovoltaic assembly enters a working region surrounded by the structure frame 700, the photovoltaic assembly can be in an appropriate position, that is, for example, in the center position of the four secondary trimming assemblies 10 in the secondary trimming device for a photovoltaic assembly, thereby enabling the secondary trimming device for a photovoltaic assembly to cut the curing adhesive at the four corners of the photovoltaic assembly.

In one or more embodiments, the long-edge correction assembly 710 includes a long-edge drive apparatus 711 and a correction rod 712 connected to the long-edge drive apparatus 711. The long-edge drive apparatus 711 is disposed on the structure frame 700. At least one roller 713 is disposed on the correction rod 712. Flexible foam may be disposed on the at least one roller 713. In this case, the at least one roller 713 can be in flexible contact with the long edges of the photovoltaic assembly, thereby preventing the photovoltaic assembly from damage. The short-edge correction assembly 720 includes a short-edge drive apparatus 721. A roller 713 is also disposed on the short-edge drive apparatus 721, and flexible foam may be disposed on the roller 713, thereby reducing the damage to the photovoltaic assembly. In one or more embodiments, the operator may select a cylinder, a motor, or another drive component to serve as the long-edge drive apparatus 711 and the short-edge drive apparatus 721.

What is claimed is:

1. A secondary trimming device for a photovoltaic assembly, characterized in that the secondary trimming device for the photovoltaic assembly is used for a secondary cleaning of curing adhesive at four corners of the photovoltaic assembly, and the secondary trimming device for the photovoltaic assembly comprises:

first clamping drive apparatuses, wherein two blades are disposed on sides of the first clamping drive apparatuses facing the photovoltaic assembly, and the first clamping drive apparatuses are able to drive the two blades to get close to the photovoltaic assembly;

second clamping drive apparatuses, wherein the second clamping drive apparatuses are connected to ends of the first clamping drive apparatuses facing away from the photovoltaic assembly, the second clamping drive apparatuses are connected to the first clamping drive apparatuses through connection plates, and the second clamping drive apparatuses are able to drive the first clamping drive apparatuses to rotate; and a fixing base, wherein the first clamping drive apparatuses and the second clamping drive apparatuses are each disposed on the fixing base;

wherein a number of the first clamping drive apparatuses is two and a number of the second clamping drive apparatuses is two, and wherein each of the second clamping drive apparatuses is configured to drive a connection plate of the connection plates to move in a horizontal direction, and the two first clamping drive apparatuses are able to get close to each other to enable end portions of the two blades to abut against each other so that the curing adhesive at the corners of the photovoltaic assembly is cut and removed by the two blades.

2. The secondary trimming device for a photovoltaic assembly according to claim 1, characterized in that the secondary trimming device for the photovoltaic assembly further comprises a push-out drive apparatus and a first support plate, wherein the second clamping drive apparatuses are disposed on the first support plate, and the push-out drive apparatus is connected to the first support plate and is able to drive the first support plate to move in a direction facing the photovoltaic assembly.

3. The secondary trimming device for a photovoltaic assembly according to claim 2, characterized in that the secondary trimming device for the photovoltaic assembly further comprises a lifting drive apparatus and a second support plate, wherein the push-out drive apparatus is disposed on the second support plate, and the lifting drive apparatus is connected to the second support plate and is able to drive the second support plate to go up and down.

4. The secondary trimming device for a photovoltaic assembly according to claim 3, characterized in that the secondary trimming device for the photovoltaic assembly further comprises a third support plate disposed on the fixing base, wherein the lifting drive apparatus is disposed on the third support plate.

5. The secondary trimming device for a photovoltaic assembly according to claim 4, characterized in that a slide rail is disposed on the fixing base, a sliding chute is disposed on the third support plate, and the sliding chute is slidably connected to the slide rail.

6. The secondary trimming device for a photovoltaic assembly according to claim 2, characterized in that the secondary trimming device for the photovoltaic assembly further comprises a material receiving box, wherein a receiver channel is disposed on the first support plate, and the receiver channel is connected to the material receiving box.

7. The secondary trimming device for a photovoltaic assembly according to claim 1, characterized in that the secondary trimming device for the photovoltaic assembly further comprises a structure frame, a long-edge correction assembly, and a short-edge correction assembly, wherein the long-edge correction assembly and the short-edge correction assembly are each disposed on the structure frame.

8. The secondary trimming device for a photovoltaic assembly according to claim 7, characterized in that the long-edge correction assembly comprises a long-edge drive apparatus and a correction rod connected to the long-edge drive apparatus, and the long-edge drive apparatus is disposed on the structure frame.

9. The secondary trimming device for a photovoltaic assembly according to claim 8, characterized in that a plurality of rollers are disposed on the correction rod.

10. The secondary trimming device for a photovoltaic assembly according to claim 3, characterized in that the secondary trimming device for the photovoltaic assembly further comprises a material receiving box, wherein a receiver channel is disposed on the first support plate, and the receiver channel is connected to the material receiving box.

11. The secondary trimming device for a photovoltaic assembly according to claim 4, characterized in that the secondary trimming device for the photovoltaic assembly further comprises a material receiving box, wherein a receiver channel is disposed on the first support plate, and the receiver channel is connected to the material receiving box.

12. The secondary trimming device for a photovoltaic assembly according to claim 5, characterized in that the secondary trimming device for the photovoltaic assembly further comprises a material receiving box, wherein a receiver channel is disposed on the first support plate, and the receiver channel is connected to the material receiving box.

13. The secondary trimming device for a photovoltaic assembly according to claim 2, characterized in that the secondary trimming device for the photovoltaic assembly further comprises a structure frame, a long-edge correction assembly, and a short-edge correction assembly, wherein the long-edge correction assembly and the short-edge correction assembly are each disposed on the structure frame.

14. The secondary trimming device for a photovoltaic assembly according to claim 3, characterized in that the secondary trimming device for the photovoltaic assembly further comprises a structure frame, a long-edge correction assembly, and a short-edge correction assembly, wherein the long-edge correction assembly and the short-edge correction assembly are each disposed on the structure frame.

15. The secondary trimming device for a photovoltaic assembly according to claim 4, characterized in that the secondary trimming device for the photovoltaic assembly further comprises a structure frame, a long-edge correction assembly, and a short-edge correction assembly, wherein the long-edge correction assembly and the short-edge correction assembly are each disposed on the structure frame.

16. The secondary trimming device for a photovoltaic assembly according to claim 5, characterized in that the secondary trimming device for the photovoltaic assembly further comprises a structure frame, a long-edge correction assembly, and a short-edge correction assembly, wherein the long-edge correction assembly and the short-edge correction assembly are each disposed on the structure frame.

* * * * *